(12) United States Patent
Nayebi et al.

(10) Patent No.: US 6,177,825 B1
(45) Date of Patent: Jan. 23, 2001

(54) FAST HIGH SIDE SWITCH FOR HARD DISK DRIVE PREAMPLIFIERS

(75) Inventors: Mehrdad Nayebi, Palo Alto; Murat Hayri Eskiyerli, San Jose; Phil Shapiro, Palo Alto, all of CA (US)

(73) Assignees: Sony Corporation, Tokyo (JP); Sony Electronics Inc., Park Ridge, NJ (US)

( * ) Notice: Under 35 U.S.C. 154(b), the term of this patent shall be extended for 0 days.

(21) Appl. No.: 09/282,868

(22) Filed: Mar. 31, 1999

(51) Int. Cl.[7] .......................... H03K 17/04; H03K 17/60
(52) U.S. Cl. .............................. 327/374; 327/478
(58) Field of Search .................................. 327/374–377, 327/478, 482–492, 427, 434–437, 65, 66, 390, 589, 536

(56) References Cited

U.S. PATENT DOCUMENTS 4,654,543 * 3/1987 Atsumi ................................ 327/439
5,243,232 * 9/1993 Bolda et al. ........................ 327/478
5,834,964 * 11/1998 Scheraga ............................ 327/478

* cited by examiner

Primary Examiner—Toan Tran
(74) Attorney, Agent, or Firm—Mayer, Fortkort & Williams; Karin L. Williams, Esq.

(57) ABSTRACT

A fast high side switch for hard disk drive preamplifiers requires very fast turn on time, very low impedance when the switch is "on" and very high impedance when the switch is turned "off". Each of the embodiments described provide a low-impedance path between the "Boost Voltage" and "Switch Out" terminals of the hard disk drive preamplifier, i.e., connecting a boost-voltage to the inductor, and as required in such a system, the proposed circuits provide a turn-on time that is much faster than the rise-time of the write current.

7 Claims, 2 Drawing Sheets

FAST HIGH SIDE SWITCH FOR HARD DISK DRIVE PREAMPLIFIERS

CROSS-REFERENCE TO RELATED APPLICATIONS

The present invention is related to an invention that is the subject matter of a commonly-assigned co-pending application entitled "Voltage Boost Circuitry for Hard Disk Drive Write Preamplifiers", filed concurrently herewith, which is hereby incorporated by reference herein and is also related to an invention that is the subject matter of a commonly-assigned co-pending application entitled "Architecture for Hard Disk Drive Write Preamplifiers", also filed concurrently herewith, also incorporated by reference herein.

BACKGROUND OF THE INVENTION

The present invention relates generally to a fast high side switch for hard disk drive preamplifiers and, more particularly, to a fast high side switch circuit that provides very fast switching between two terminals (i.e. fast turn-on time), has very low impedance when the switch is "on", and exhibits very high impedance between the two terminals when the fast high side switch is turned "off".

Write speeds in hard disk drive preamplifiers are continually improving. An inductive write head includes an inductive coil that can change the localized magnetic fields on the magnetic data-storage medium and thus allows the digital data to be recorded. The speed of this recording process (i.e., the write speed) is determined by how fast the current in a hard disk drive write head can be reversed (the polarity of the write current through the write head being reversed in response to the bit pattern of the information signal). This is also referred to as the "rise-time". Typically the desired requirements for the write driver are a large current capability (e.g., 40–80 ma) combined with a fast rise time (e.g., 1–4 ns) for driving the inductive write head.

The write head for a disk data storage device can be approximately modeled by an inductor with an inductance of L. The voltage across an inductor is ideally proportional to the rate of change of the current through the inductor in time. The mathematical expression for this voltage is given as $V_L = L \, di/dt$. Essentially, the voltage across the inductive write head, $V_L$, is proportional to the value of inductance, L, and to the speed at which the write current is reversed, $di/dt$. This means that the write current reversal time in inductive write-heads fundamentally depends on how large a voltage can be impressed across the write drive head. Normally, the voltage across the inductor is limited by the supply voltages. Thus, either the head inductance value should be decreased, or, the supply voltage should be increased, to improve the write speed. The first option, decreasing the head inductance value, is normally not preferred, as it negatively affects the reliability of the data-recording process.

Conventional techniques use the power supply to generate the voltage across the inductor. However, the voltage supply limits the voltage that can be applied across the inductor and therefore limits the rise time. Higher write speeds require higher supply voltages. However, the second alternative, increasing the supply voltage, may not always be possible, as system-wide considerations dictate the selection of power supply voltages, and the present trend in fact is the reduction of power supply voltages.

The present invention is therefore directed to the problem of developing a hard disk drive preamplifier that satisfies the demand for improved rise-time while meeting the conflicting demand for maintaining a same supply voltage. This requires a high side switch, whose turn on time is much faster than the rise time, to connect the boost voltage to the inductor.

SUMMARY OF THE INVENTION

It is an object of the present invention to solve these problems by providing a fast high side switch, for fast switching, from a high impedance non-conductive state to a low impedance conductive state, between two terminals.

In one embodiment of the invention, the fast high side switch has a control circuit, including a first input terminal and a second input terminal, for turning the switch on and off at a fast speed, a pnp transistor that is turned on when the first input terminal is high and a first npn transistor, the base coupled to the collector of the pnp transistor, the first npn transistor going into saturation when the pnp transistor turns on. In addition, a second npn transistor is provided, the collector coupled to a first of the two terminals, the emitter coupled to a second of the two terminals, and the base coupled to the emitter of the first npn transistor. The second npn transistor turns on after the first npn transistor goes into saturation, thereby closing the switch and providing a connection between the two terminals. A capacitor is connected between the base and the emitter of the second npn transistor, and the emitter current of the first npn transistor is divided between the base current of the second npn transistor and the capacitor.

In a specific embodiment of the invention the fast high side switch includes a clamp circuit, which comprises a resistor and a plurality of transistors, and in still a further embodiment, the clamp circuit is matched.

In operation the pnp transistor of the fast high side switch, is turned off when the second input terminal is high and the first input terminal is low and the second npn transistor stays high until the capacitor is discharged and then turns off The control circuit according to one embodiment includes a differential npn transistor pair, and the tail current of the differential pair may be independently controlled by a third input terminal, which can further be used to turn off the fast high side switch irrespective of the first input terminal and the second input terminal.

In an alternative embodiment of the invention, the fast high side switch includes a control circuit for turning the switch on and off at a fast speed, a first npn transistor and a second npn transistor. The collector of the second npn transistor is coupled to a first of the two terminals, the emitter is coupled to a second of the two terminals and a resistor is coupled between the emitter of the first npn transistor, and the base of the second npn transistor. A capacitor is coupled to the emitter of the first npn transistor and the emitter of the second npn transistor. In this embodiment, the second npn transistor turns on after the first npn transistor goes into saturation, thereby closing the switch and providing a connection between the two terminals.

As a further aspect of one embodiment of the invention, the control circuit includes a third npn transistor that turns on and off under the control of the signals input to the first input terminal and the second input terminal. The third npn transistor is prevented from entering deep saturation by a clamp transistor.

As a still further aspect of one embodiment of the invention, the level of charge on the capacitor is controlled by discharging the capacitor through the resistor and, if the third npn transistor is on, through the third npn transistor. If however, the third npn transistor is off, the capacitor is quickly charged by the emitter current of the first npn transistor.

The features of the invention believed to be novel are set forth with particularity in the appended claims. The invention itself however may be best understood by reference to the following detailed description taken in conjunction with the accompanying drawings.

DETAILED DESCRIPTION

Figure 1:
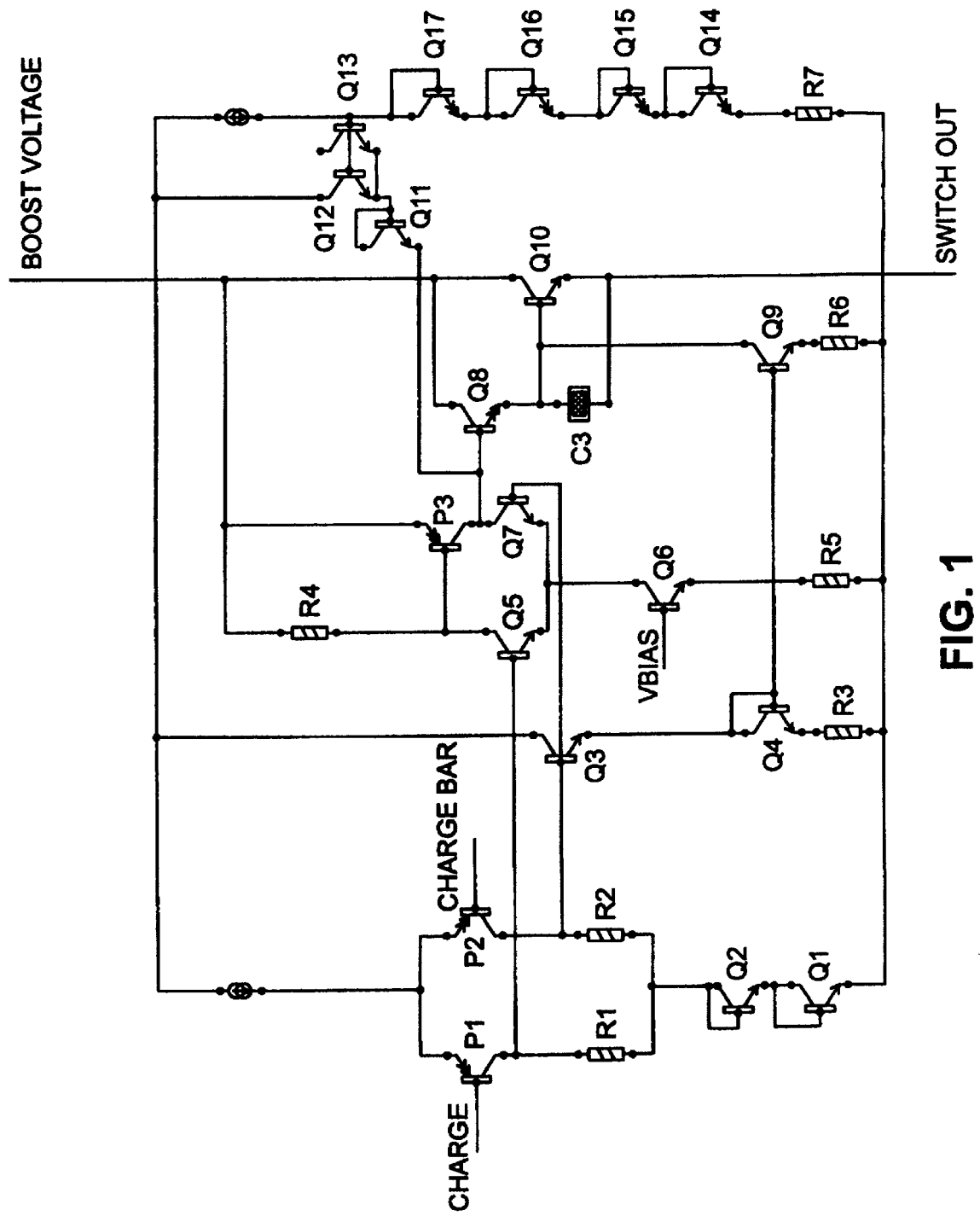
FIG. 1 depicts a preferred embodiment of a fast high side switch in accordance with the principles of the present invention.

The circuit for the proposed fast high side switch for hard disk drive preamplifiers is shown in FIG. 1. The purpose of this circuit is to provide very fast switching between two terminals, e.g., "Boost Voltage" and "Switch-Out" for applying a boost voltage to an inductive write head. The proposed switch should provide three key features, which are each typically difficult to achieve with bipolar fabrication technology.

First, the turn-on time of the switch must be much faster than the rise-time of the write current. Accordingly, the connection should be accomplished in a very short period of time, i.e. have a very fast turn-on time. In addition, the fast high side switch should have very low impedance when the switch is "on". Finally, when the fast high side switch is turned "off" it should exhibit very high impedance between its two terminals, so as to prevent the leakage of charge from the "Boost Voltage" terminal. To summarize, the fast high side switch should provide the following three characteristics:

1. Very-fast turn-on time.
2. Low "on-state" impedance.
3. Very-high "off-state" impedance.

A simplified circuit diagram of a preferred embodiment of the proposed high side switch is shown in FIG. 1. The "CHARGE" and "CHARGE_BAR" lines are the input terminals and switch. When "CHARGE_BAR" is high, the base of transistor Q5 is high, while the base of transistor Q7 is low. In this state, the switch is "ON" creating a low-impedance path, between the "ROOST VOLTAGE" and "SWITCH OUT" terminals.

However, when the "CHARGE" line is high, the base of transistor Q5 is pulled low, and as a result, there is very high impedance path between the "BOOST VOLTAGE" and "SWITCH OUT" terminals, i.e., the switch is "OFF".

More specifically, the npn transistors Q5 and Q7 make up a differential pair whose tail current can be controlled by "VBIAS". The VBIAS line can also be used to shut off the high-side switch, irrespective of the input signals "CHARGE" and "CHARGE_BAR".

Transistors P3, Q8 and Q10 are key components of the proposed fast high side switch circuit. When the base of transistor Q5 is high, transistor P3 is turned on by transistor Q5, transistor Q8 goes into saturation, and then transistor Q10 also turns on. The emitter current of transistor Q8 is divided between the base current of transistor Q10 and the charging capacitor C3. Charging capacitor C3 increases the voltage across it, according to the formula: $\Delta V=(i/C)\Delta t$, where C is the capacitor C3 value. This action in turn aids the turn-on transient of transistor Q10 by increasing the base-emitter voltage. Transistor Q10 saturates against the boost voltage terminal.

When the base of transistor Q5 goes low, transistor P3 turns off and it no longer supplies the base current of transistor Q8. Transistor Q10 stays high until capacitor C3 is discharged and then turns-off, turning off the switch and the connection between the BOOST VOLTAGE and SWITCH OUT terminals, and providing a very-high "OFF" state impedance to prevent the leakage of charge from the BOOST VOLTAGE terminal.

It will be appreciated by those skilled in the art that transistors Q11–Q17 and resistor R7 make up a clamp circuit to prevent transistor Q7 from going into the deepsaturation region of operation. This clamp circuit is matched with the transistors Q1, Q2, Q7 and resistor R2 combination.

Accordingly, the proposed circuitry illustrated in FIG. 1 provides very fast switching between the two terminals "Boost Voltage" and "Switch-Out" and accomplishes the three objectives set out in detail above, a very fast turn-on time, a very low impedance when the switch is "on", and a very high impedance between its two terminals when the switch is "off".

Figure 2:
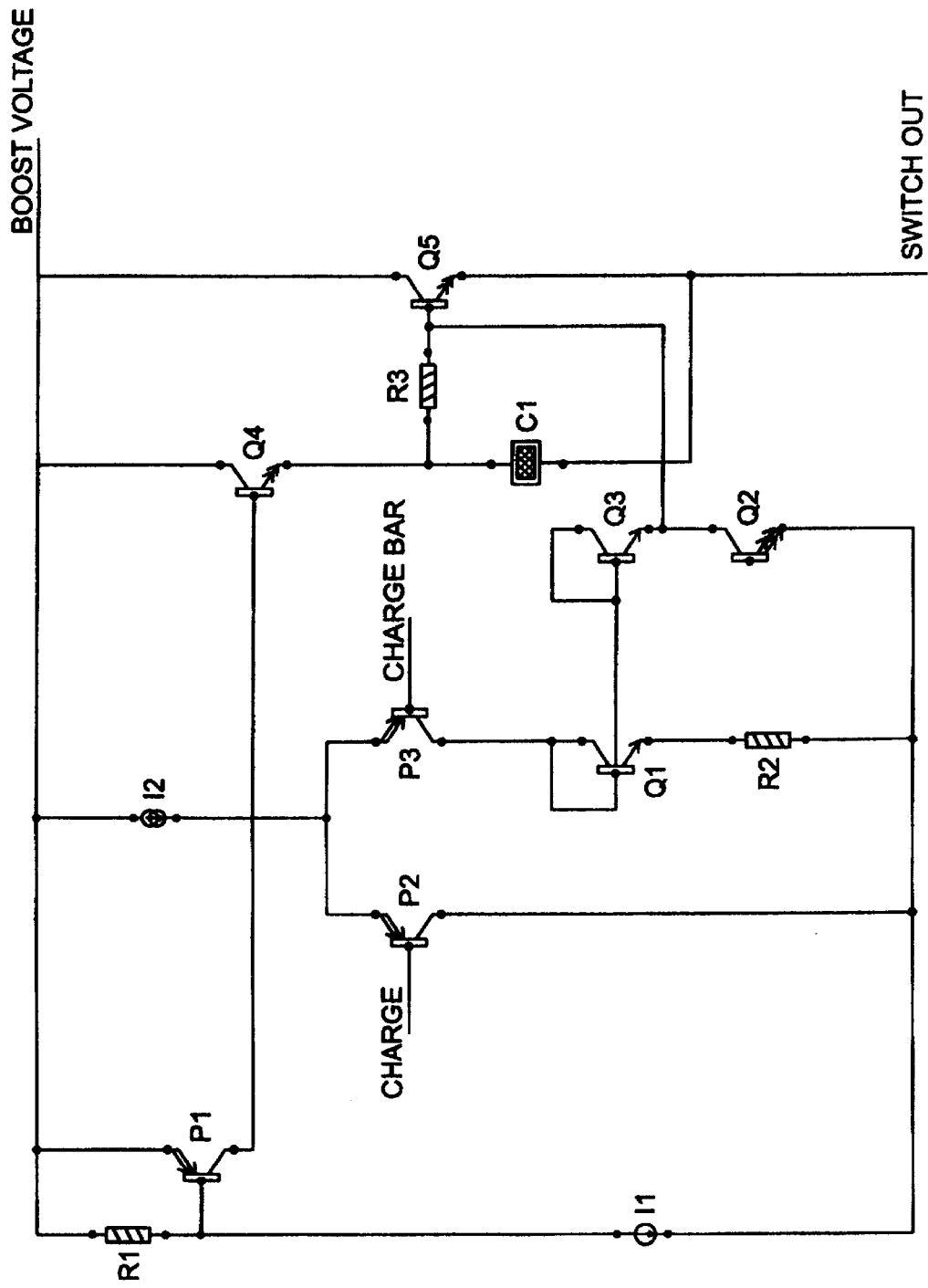
FIG. 2 depicts an alternative embodiment of a fast high side switch in accordance with the principles of the present invention

Another implementation of a fast high-side switch is shown in FIG. 2. This implementation also includes a two-transistor combination. In particular, the behavior PATENT of transistors Q4 and Q5 and capacitor C1 is similar to that of transistors Q8 and Q10 and capacitor C3 in FIG. 1. However, as shown in FIG. 2, the level of charge on capacitor C1 is controlled by discharging the capacitor through resistor R3 and transistor Q2 (if transistor Q2 is turned on). However, once transistor Q2 is turned off, capacitor C1 is quickly charged by the emitter current of transistor Q4. Once the voltage across capacitor C1 reaches $V_{be5}+I_{b5}R_3$, where $V_{be5}$ and $I_{b5}$ are base-emitter voltage and base current, respectively, of transistor Q5, transistor Q5 is turned on.

When "CHARGE" is high, transistors Q2 and P2 are turned off, while transistor P3 is turned on. The collector current of transistor P3 turns on transistor Q2 when $I_{p3}R_2 \geq V_{be,Q2}$. Transistor Q2 is prevented from entering into deep-saturation by clamp transistor Q3. Thus, transistor Q2 creates a low discharge path between capacitor C1 and ground, whose impedance is determined by resistor R3. The time constant for this charge is approximately given by $\tau_d = C1R3$. This discharge time constant also creates a minimum frequency for "CHARGE" signal switching, below which this type of high-side switch is not effective.

Once "CHARGE_BAR" is pulled high, transistor Q2 turns off, thereby removing the low impedance path between the base of transistor Q5 and ground. This action allows the charging of capacitor C1 quickly to turn on transistor Q5 heavily. The charging time-constant of is determined by $r_{e4}$ emitter impedance of transistor Q4 assuming that $R_3+r_{\Pi5}>>r_{e4}$. Capacitor C1 also supplies transistor Q5 base current when transistor Q5 needs more base current than transistor Q4 can supply.

Thus, the high side switch can be totally turned off by transistor Q4, which is controlled by the current source I1, i.e., if current source I1 is turned off, transistor Q4 is off, and therefore the switch is in "OFF" state, irrespective of the input signals CHARGE and CHARGE_BAR.

The present invention has been described in terms of specific embodiments incorporating details to facilitate the understanding of the principles of operation of the invention. Such reference herein to specific embodiments and details thereof is not intended to limit the scope of the claims appended hereto. For example, while the preferred embodiment of the present invention has been illustrated and described using bipolar transistors, it will be appreciated by those skilled in the art that the circuit of the present invention may be implemented using another device technology, including but not limited to CMOS, MOS, discrete components and ECL. In addition, different circuit configurations could also be substituted to perform the same functions of the preferred embodiment. Various modifications may be made in the embodiments chosen for illustration without departing from the spirit and scope of the invention.

What is claimed is:

1. A fast high side switch, for fast switching, from a high impedance nonconductive state to a low impedance conductive state, between two terminals, the switch comprising:

a control circuit for turning the switch on and off at a fast speed, said control circuit including a first input terminal and a second input terminal;

a pnp transistor coupled to the control circuit, said pnp transistor being turned on when the first input terminal is high;

a first npn transistor, the base of said first npn transistor coupled to the collector of said pnp transistor, and said first npn transistor going into saturation when said pnp transistor turns on;

a second npn transistor, the collector of said second npn transistor coupled to a first of the two terminals, the emitter of said second npn transistor coupled to a second of the two terminals, and the base of said second npn transistor coupled to the emitter of said first npn transistor, wherein said second npn transistor turns on after said first npn transistor goes into saturation, thereby closing the switch and providing a connection between the two terminals; and a capacitor, connected between the base and the emitter of said second npn transistor, wherein the emitter current of said first npn transistor is divided between the base current of said second npn transistor and said capacitor.

2. The fast high side switch of claim 1, further comprising a clamp circuit connected to the base of the first npn transistor.

3. The fast high side switch of claim 2, wherein said clamp circuit comprises a resistor and a plurality of transistors.

4. The fast high side switch of claim 1, wherein said pnp transistor is turned off when the second input terminal is high and the first input terminal is low.

5. The fast high side switch of claim 4, wherein said second npn transistor stays high until said capacitor is discharged and then turns off.

6. The fast high side switch of claim 1, said control circuit further comprising a differential npn transistor pair, wherein the tail current of the differential pair may be independently controlled by a third input terminal.

7. The fast high side switch of claim 6, wherein the third input terminal can further be used to turn off the fast high side switch irrespective of the first input terminal and the second input terminal.

* * * * *